(12) United States Patent
Zeidler et al.

(10) Patent No.: US 8,598,525 B2
(45) Date of Patent: Dec. 3, 2013

(54) PARTICLE BEAM SYSTEM

(75) Inventors: Dirk Zeidler, Oberkochen (DE); Thomas Kemen, Aalen (DE)

(73) Assignee: Carl Zeiss Microscopy GmbH, Jena (DE)

( * ) Notice: Subject to any disclaimer, the term of this patent is extended or adjusted under 35 U.S.C. 154(b) by 200 days.

(21) Appl. No.: 13/176,746

(22) Filed: Jul. 6, 2011

(65) Prior Publication Data

US 2012/0199740 A1    Aug. 9, 2012

(30) Foreign Application Priority Data

Jul. 6, 2010    (DE) .......................... 10 2010 026 169

(51) Int. Cl.
*H01J 37/28* (2006.01)
*H01J 37/147* (2006.01)

(52) U.S. Cl.
USPC ........... 250/310; 250/305; 250/306; 250/307; 250/309; 250/396 R (58) Field of Classification Search
USPC ...... 250/305, 306, 307, 309, 310, 311, 396 R
See application file for complete search history.

(56) References Cited

U.S. PATENT DOCUMENTS

| | | | |
|---|---|---|---|
| 2,944,172 A | | 7/1960 | Opitz et al. |
| 3,474,245 A * | | 10/1969 | Tamura et al. ................. 250/310 |
| 5,146,089 A | | 9/1992 | Rosien |
| 6,031,230 A | | 2/2000 | Toumatsu |
| 6,211,525 B1 | | 4/2001 | Cowham |
| 7,084,406 B2 * | | 8/2006 | Knippelmeyer .............. 250/397 |
| 7,554,094 B2 * | | 6/2009 | Knippelmeyer et al. ...... 250/396 ML |
| 8,039,813 B2 * | | 10/2011 | Casares et al. ............ 250/396 R |
| 8,097,847 B2 * | | 1/2012 | Knippelmeyer et al. ...... 250/309 |
| 8,164,046 B2 * | | 4/2012 | Major ........................ 250/237 R |
| 2006/0249674 A1 | | 11/2006 | Slowko |
| 2009/0256075 A1 * | | 10/2009 | Kemen et al. .................. 250/307 |
| 2011/0012010 A1 * | | 1/2011 | Major .......................... 250/201.1 |
| 2011/0013171 A1 * | | 1/2011 | Mueller et al. .................. 355/74 |
| 2011/0215241 A1 * | | 9/2011 | Wang et al. ..................... 250/307 |
| 2012/0032079 A1 * | | 2/2012 | Nakasuji et al. ............... 250/310 |
| 2012/0199740 A1 * | | 8/2012 | Zeidler et al. .................. 250/310 |
| 2012/0217393 A1 * | | 8/2012 | Okai et al. ..................... 250/310 |

(Continued)

FOREIGN PATENT DOCUMENTS

DE    1119428    12/1961

OTHER PUBLICATIONS

P. Schauer et al., "Efficiency of SEM/STEM Scintillation Electron Detectors with Edge Guided Signal", Multinational Congress on Electron Microscopy, Parma, 1993, p. 357-358.

(Continued)

*Primary Examiner* — David A Vanore
(74) *Attorney, Agent, or Firm* — Bruce D Riter (57) ABSTRACT

A particle beam system comprises a particle beam source for generating a particle beam, an objective lens for focusing the particle beam onto an object plane, wherein the objective lens comprises a focal length and an optical axis, and a scintillator arrangement, which comprises an electron receiving surface facing the object plane and which is arranged such that it is exposed to electrons, which emanate from the object plane. The scintillator arrangement further comprises a light exit face, wherein the scintillator arrangement is configured such that light rays which are generated by electrons, which are incident on the electron receiving surface leave the scintillator arrangement at the light exit face.

21 Claims, 4 Drawing Sheets

(56) References Cited

U.S. PATENT DOCUMENTS

2012/0241605 A1* 9/2012 Shemesh .................. 250/305
2012/0273677 A1* 11/2012 Tuma et al. ................ 250/307
2012/0286159 A1* 11/2012 Donitz et al. .............. 250/309

OTHER PUBLICATIONS

R. Autrata et al., "Single crystal scintillation detectors for LVSEM", Electron Microscopy, Symposium O, vol. 1, 1998, p. 437-438.

R. Autrata et al., "Single-Crystal Aluminates—A New Generation of Scintillators for Scanning Electron Microscopes and Transparent Screens in Electron Optical Devices", Scanning Electron Microscopy, 1983, p. 489-500.

I. Müllerová, "Imaging of Specimens at Optimized Low and Very Low Energies in Scanning Electron Microscopy", Scanning Microscopy, vol. 13, Nr. 1, 1999, p. 7-22.

Office action in German patent application No. 10 2010 026 169.6 dated Nov. 15, 2010.

* cited by examiner

PARTICLE BEAM SYSTEM

CROSS-REFERENCES TO RELATED APPLICATIONS

The present application claims priority of Patent Application No. 10 2010 026 169.6 in Germany, entitled "Particle Beam System", the content of which is hereby incorporated by reference in its entirety.

FIELD

The present invention relates to a particle beam system and a scintillation detector.

BACKGROUND

Conventional particle beam. systems, such as electron microscopes, comprise an objective lens for focusing a particle beam onto an object under inspection and a detector for detecting electrons, which emanate from the object. The electron detector may be arranged either outside of the particle beam column close to the object or within the particle beam column. In the latter conventional electron microscopes, electrons, which emanate from the object under inspection, first enter the objective lens, then traverse the electron lens before being incident onto the electron detector. The electron detector may be configured as a scintillation detector.

However, in such a design, the electron detector is arranged at a comparatively large distance from the object. Therefore, it is a problem that only a comparatively small portion of electrons, which emanate from the object are incident onto the detector.

On the other hand, it is not a simple matter to arrange the scintillation detector of the conventional electron microscope closer to the object, the objective lens, too, has to be arranged close to the object. Therefore, the space, which is available in the vicinity of the object is limited. Accordingly, it is not easy to arrange the scintillation detector within the interior of the objective lens. Furthermore, it is difficult to transfer light signals which are generated in the scintillation detector to the outside of the objective lens.

However, it is possible to modify the conventional scintillation detector such that the scintillator detector comprises an electron receiving surface, which is arranged comparatively close to the object and a light exit face, which is arranged at a significantly larger distance from the object compared to the electron receiving surface. Thereby, it is possible to also place components, which process the light rays generated in the scintillator arrangement, at a large distance from the object. Therefore, these components do not have to be arranged in the limited space in the vicinity of the object.

For this purpose, the scintillator arrangement may comprise a light guide body, which guides light rays, which are generated, by scintillation events away from, the object. Alternatively, the scintillator arrangement may comprise an electron guiding body such as a micro channel plate, which guides electrons away from the object which may additionally also increase the number of electrons.

SUMMARY

According to embodiments, the particle beam system comprises a particle source for generating a particle beam, an objective lens for focusing the particle beam onto an object plane and a scintillator arrangement which comprises an electron receiving surface, which is arranged such that it is exposed to electrons, which emanate from the object plane, and wherein the scintillator arrangement further comprises a light exit face, wherein the scintillator arrangement is configured, to output light rays, which are generated by electrons being incident on the electron receiving surface.

The particles which are directed onto the object plane as a particle beam may be electrons or ions such as positively charged ions or negatively charged ions. The particle beam source may therefore be an electron beam source or an ion beam source.

The electron receiving surface is exposed to electrons, which emanate from the object plane. In other words, a portion of the electrons, first incident on the electron receiving surface after having emanated from the object plane.

The objective lens, which focuses the particle beam onto the object plane may be configured to generate magnetic fields and/or electric fields for focusing the particle beam. Hence, the objective lens may comprise a magnetic objective lens, which generates a focusing magnetic field. Also, the objective lens may comprise an electrostatic focusing lens, which generates a focusing electric field. Alternatively, the objective lens may comprise a combination of a magnetic objective lens and an electrostatic focusing lens, which generates a focusing magnetic field and a focusing electrostatic field, wherein the focusing magnetic field and the focusing electrostatic field may spatially overlap.

The scintillator arrangement may be configured to convert received electrons into light rays. For this purpose, the scintillator arrangement comprises a suitable scintillator material. The scintillator material may be arranged in contact with a layer, which provides the electron receiving surface of the scintillator arrangement. Additionally or alternatively, the scintillation material may provide the electron receiving surface (i.e. a surface of the scintillator material forms the electron receiving surface). The scintillator material may be in the form of a layer, wherein a surface of the layer provides the electron receiving surface. Alternatively, the scintillator material may be provided as a volume or body of material, into which electrons penetrate and generate the light rays within the volume of material. The electrons may penetrate into the volume or body of scintillator material after having traversed the electron receiving surface. The scintillator material may be light transmissive at least for the wavelengths of the generated light rays, which are to be detected.

The electron receiving surface, when measured parallel to the optical axis, may be located closer to the objective plane than a principal plane of the objective lens. "Measured parallel to the optical axis" may mean that the distance of the electron receiving surface and the objective plane as well as the distance between the principal plane and the object plane are measured along a direction, which is parallel to the optical axis.

The light guide body may be in contact with the layer or body of scintillator material. The light guide body may further provide the light exit face or may be in contact with a layer or body which forms the light exit face.

According to a further embodiment, the scintillator arrangement (21) comprises an electrically conductive layer, which provides the electron receiving surface. The electrically conductive layer may be a metallic layer. According to a further embodiment, the scintillator arrangement comprises an electrically conductive layer, which provides a portion of the electron receiving surface. The scintillator arrangement may further comprise at least one of a body or a layer of scintillator material, which provides a further portion of the electron receiving surface. The scintillator material may be conductive or non-conductive.

According to further embodiments, an electron guide is provided between the electron receiving surface of the scintillator arrangement and the scintillator material, which guides the electrons, which are incident on the electron receiving surface to the scintillator material. According to a further embodiments, the electron guide may increase the number of electrons. According to a further embodiment, the electron guide comprises a micro channel plate having an array of channels, into which the electrons to be detected enter. The number of electrons is increased by electrons impinging on inner surfaces of the channels.

According to embodiments, the scintillator arrangement comprises an electrically conductive layer or surface, which provides the electron receiving surface or a portion of the electron receiving surface, and an electrically conductive and light transmissive layer or surface, which provides the light exit face of the scintillator arrangement.

According to embodiments, the scintillator arrangement comprises a light guide body or a light guide, which is arranged between the scintillator material and the light exit face of the scintillator arrangement. In these embodiments, the scintillator material may be arranged closer to the object plane than the light exit face of the scintillator arrangement. The light guide may for example be a hollow light guide.

According to embodiments of the particle beam system, the scintillator arrangement is configured such that the electron receiving surface is arranged much closer to the object plane than the light exit face. According to further embodiments, a maximum distance between the electron receiving surface and the light exit face is greater than 5 mm, in particular greater than 10 mm and further in particular greater than 15 mm. The maximum distance may be less than 25 mm or less than 20 mm.

According to further embodiments of the particle beam system, a first distance measured in a direction parallel to the optical axis between an electron receiving surface of the scintillator arrangement and a light exit face of the scintillator arrangement is greater than 0.2 times, in particular greater than 0.4 times the focal length of an objective lens, or greater than the focal length of the objective lens, wherein the objective lens is configured to focus a particle beam on the object plane.

The first distance may be greater than two times the focal length or greater than four times the focal length of the objective lens. The first distance may be shorter than ten times or shorter than five times the focal length of the objective lens. The first distance is measured in a direction parallel to the optical axis. In other words, the first distance is a minimum height difference of the electron receiving surface and the light exit face with respect to the object plane (i.e. a plane perpendicular to the optical axis).

According to further embodiments of a particle beam system, an electron receiving surface of a scintillator arrangement, when measured parallel to the optical axis, is arranged closer to an object plane than a principal plane of an objective lens, wherein the objective lens is configured to focus the particle beam onto the object plane, and wherein a light exit face of the scintillator arrangement, when measured parallel to the optical axis, is located at a greater distance from the object plane than the principal plane of the objective lens.

The distance of the electron receiving surface from the object plane is measured along a direction which is parallel to the optical axis. In other words, the distance is calculated, by determining a minimum distance vector between the electron receiving surface and the object plane (i.e. a distance vector of minimum length). Since the objective plane indicates a mathematical plane, which is not limited in its lateral extent, the minimum distance vector is oriented perpendicular to the object plane. Hence, the distance of the electron receiving surface is a minimum height of the electron receiving surface with respect to the object plane. The distance of the light exit face from the object plane is calculated accordingly. The principal plane may be oriented parallel to the object plane.

The principal plane may be one of several principal planes of the objective lens. The principal plane may be a principal plane among all principal planes of the objective lens, which is located closest to the object plane or which is located farthest from the particle source.

According to a further embodiment, an electron receiving surface of a scintillator arrangement, when measured parallel to the optical axis, is arranged closer to an object plane than a first principal plane of an objective lens, which is located closest to the object plane, and wherein a light exit face of the scintillator arrangement, when measured parallel to the optical axis, is located at a greater distance from the object plane than a second principal plane of the objective lens, which is located farthest from the object plane.

According to further embodiments of a particle beam system, a maximum cross-sectional area of a light guide body, measured perpendicular to the optical axis of the objective lens, wherein the objective lens is configured to focus a particle beam, is at least two times greater than an area of an electron receiving surface projected onto a plane, which is oriented perpendicular to the optical axis.

According to a further embodiment, of a particle beam system, a maximum cross-sectional extent of the light guide body measured perpendicular to an optical axis of an objective lens, wherein the objective lens is configured, to focus a particle beam, is smaller than a second distance measured parallel to the optical axis between a location of the electron receiving surface, which is located, closest to the object plane and a plane of the maximum cross-sectional extent. The plane of the maximum cross-sectional extent may be oriented perpendicular to the optical axis and may comprise the cross-section, which has the maximum cross-sectional extent. The second distance may therefore be a height of the location of the electron receiving surface, which is located closest to the object plane, with respect to the plane of the maximum cross-sectional extent.

The maximum cross-sectional extent may be a maximum extent of a cross-section, which is determined from all cross-sections of the light guide body, which are perpendicular to the optical axis. One of these cross-sections has an extent which is greater than all the extents of the remaining cross-sections.

Accordingly, the embodiments described above allow to combine the scintillator arrangement with an objective lens of the particle beam. system such that the electron receiving surface of the scintillator arrangement. is located close to the object plane, wherein the light exit face is arranged comparatively far from the object plane. Thereby, components, which further transform light rays, which emanate from the light exit face of the scintillator arrangement do not have to be located, close to the object plane and thereby do not require space, which is needed for the objective lens.

According to further embodiments, the scintillator arrangement comprises a at least one of a body or a layer of a scintillator material which supports the electrically conductive layer. According to a further embodiment, the scintillator arrangement comprises at least one of a body or a layer of a scintillator material, which provides the electron receiving surface or at least a portion of the electron receiving surface.

The electrically conductive layer may be deposited onto or arranged in contact, with the body or layer of scintillator material. The body or layer of scintillator material may be arranged in contact with a light guide body. The body or layer of scintillator material may be conductive. Thereby, the body or layer of scintillator material may provide the electrically conductive layer or a portion of the electrically conductive layer. For example, the layer or body of scintillator material may be deposited on a surface of the light guide body. The light guide body may comprise or provide the light exit face.

According to embodiments, a lateral surface of the light guide body has a conical shape, which conically tapers in a direction towards the object plane. The lateral surface may be an outer lateral surface of the light guide body. The light guide body may further comprise a channel for the passage of the particle beam.

According to a further embodiment, a shortest distance between the electron receiving surface and the object plane is equal to or greater than a shortest distance between the objective lens and the object plane. The shortest distance between the electron receiving surface and the object plane may be a height of the electron receiving surface with respect to the object plane. Therefore, the shortest distance of the electron receiving surface and the object plane may be measured along a direction parallel to the optical axis. The shortest distance between the objective lens and the object plane is calculated in a corresponding way.

According to embodiments, the scintillator arrangement is arranged or received at least partly within the objective lens. According to further embodiments thereof, the objective lens comprises a magnetic objective lens, having a first pole piece and a second pole piece, which are arranged at a distance from, each other such that they define a pole gap in which a focusing magnetic field is generatable. In particular, the pole pieces and further in particular their inner faces, (i.e. the faces, which face the optical axis of the objective lens) or their lower end faces (i.e. faces, which face the object plane) may have a rotationally symmetric form. Components of the scintillator arrangement may be arranged such that they overlap with the inner or lower end faces of the first and/or the second pole piece, as seen along the optical axis. Here, the components of the scintillator arrangement are preferably made of materials, which are traversable by the magnetic fields, which emanate from the pole pieces.

In other words, the protection of the inner and/or lower end faces of the first and/or second pole piece onto the optical axis may overlap with the projection of components of the scintillator arrangement onto the optical axis.

According to further embodiments, the objective lens comprises an electrostatic objective lens, wherein the scintillator arrangement comprises components, which are arranged between electrodes of the electrostatic objective lens. According to further embodiments thereof, components of the scintillator arrangement provide electrodes of the objective lens. The electron receiving surface may provide an electrode of the objective lens. Additionally or alternatively, the light exit face may provide an electrode of the objective lens. Additionally or alternatively, a further surface of the scintillator arrangement, which is different from the electron receiving surface and the light exit face provides an electrode of the objective lens.

According to embodiments, the electron receiving surface and/or the light exit face is provided with a conductive layer. This may be advantageous for preventing unintentional charging of these surfaces during operation of the particle beam system. Furthermore, a conductive coating of these surfaces allows to use them as electrodes of an electrostatic objective lens. According to specific embodiments, the conductive coating of the electron receiving surface comprises a metallic coating, which in particular does not have to be light transmissive for the light rays, which are generated by the scintillation. The electrically conductive coating of the light exit face of the scintillator arrangement, however, is preferably light transmissive for at least a portion of the light rays, which are generated by the scintillation. According to exemplary embodiments, the electrically conductive and light transmissive coating of the light exit face of the scintillator arrangement is made of Indium Tin Oxide (ITO).

According to embodiments, the scintillator arrangement is part of an electrostatic objective lens, wherein a surface of the scintillator arrangement is configured to be electrically conductive, and wherein the surface is set at an electrical potential by a voltage supply. The electrical potential of the electrically conductive surface may be different from a further electrical potential, at which a further electrode is set by the voltage supply. The further electrode may be arranged at a distance from the electrically conductive surface of the scintillator arrangement.

According to further embodiments, the scintillator arrangement is part of an electrostatic objective lens, wherein the scintillator arrangement comprises two electrically conductive surfaces, which are sufficiently isolated from each other. The two electrically conductive surfaces may be placed at different electrical potentials by the voltage supply. According to embodiments thereof, the electrically conductive surfaces are sufficiently isolated from each other such that the different electrical potentials are maintainable at the electrically conductive surfaces by the voltage supply. Surfaces, which are arranged between the two electrically conductive surfaces may have a sufficiently high conductivity such that an undesirable electrical charging of the surfaces, which are arranged between the two electrically conductive surfaces is prevented during operation of the particle beam system.

According to embodiments, the particle beam system comprises a light detector, wherein light, which emanates from the light exit face of the scintillator arrangement is directed to the light detector. The light detector generates electrical signals in dependence on the light, which is incident on the light detector. The electrical signals may be analyzed for generating an electron microscopic image of an object, which is arranged in the object plane. According to embodiments thereof, a transfer optical system is arranged between the light exit face of the scintillator arrangement and the light detector, wherein the transfer optical system guides light traversing the light exit face to the detector. According to exemplary embodiments, the transfer optical system comprises at least one mirror, such as a convex mirror, a conceive mirror or a plane mirror.

According to further exemplary embodiments, the transfer optical system comprises a light guide, such as a light guide consisting of a light transmissive material, in which light rays are reflected by internal reflections at the surface of the light guide. The light guide may comprise a light-guiding rod or one or more or a plurality of optical fibers. Additionally or alternatively, the transfer optical system may comprise a hollow light guide.

BRIEF DESCRIPTION OF THE DRAWINGS

The forgoing as well as other advantageous features of the invention will be more apparent from the following detailed description of exemplary embodiments of the invention with reference to the accompanying drawings. It is noted that not all possible embodiments of the present invention necessarily exhibit each and every, or any, of the advantages identified herein.

DETAILED DESCRIPTION OF EXEMPLARY EMBODIMENTS

In the exemplary embodiments described below, components that are alike in function and structure are designated as far as possible by alike reference numerals. Therefore, to understand the features of the individual components of a specific embodiment, the descriptions of other embodiments and of the summary of the invention should be referred to.

Figure 1:
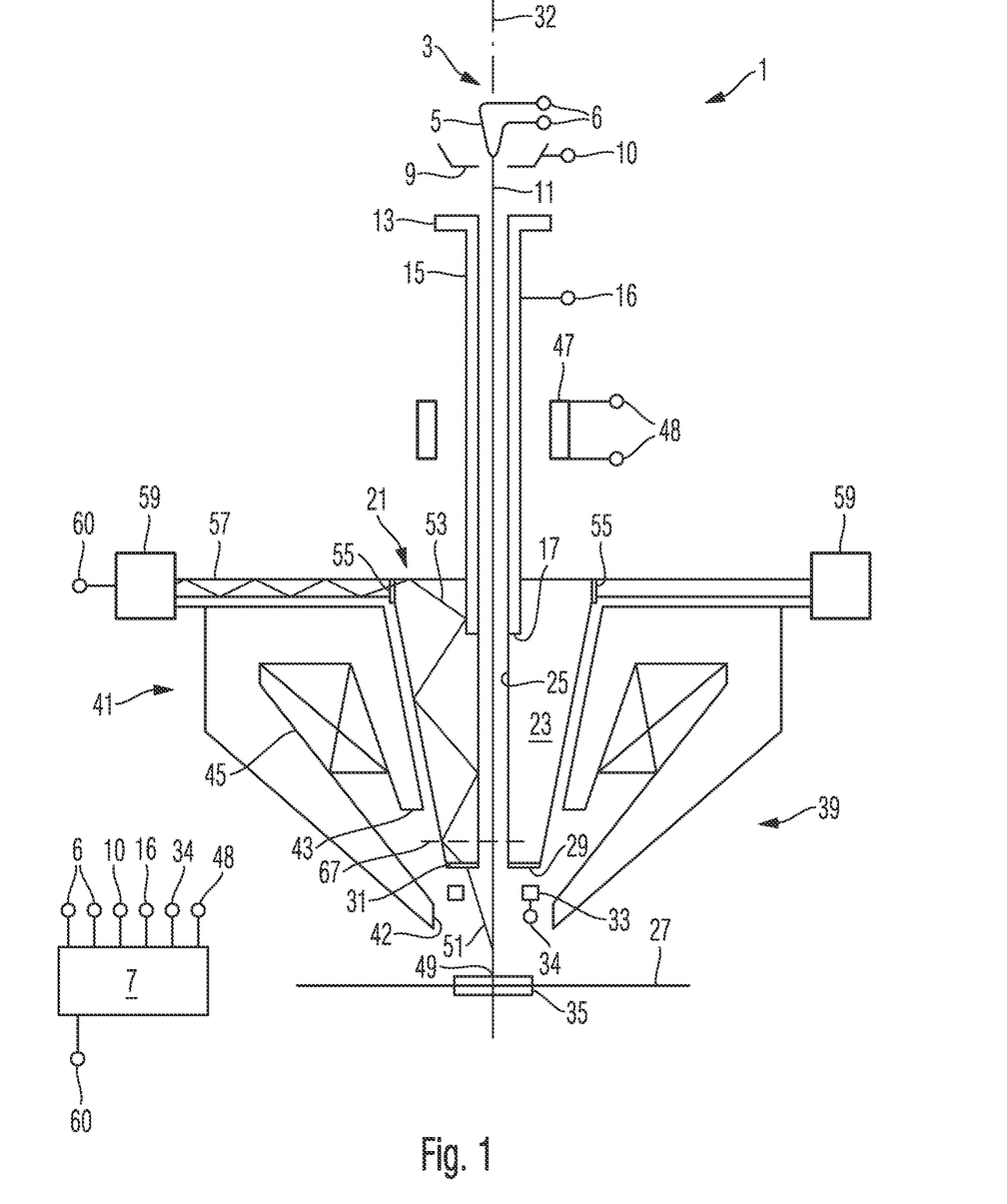
FIG. 1 is a schematical illustration of a first exemplary embodiment of a particle beam system.

FIG. 1 is a simplified schematical representation of a particle beam system 1, which comprises a particle beam source 3. In the illustrated example, the particle beam source 3 is an electron beam source having a cathode 5, which is controlled by a controller 7 via ports 6. By way of example, via ports 6, the controller 7 supplies a heating current to the cathode 5 and places the cathode 5 at a desired electrical potential. An extractor electrode 9, the potential of which is controlled by a controller 7 via port 10 extracts a particle beam 11 from the cathode 5, which is an electron beam in the illustrated example. Although in the illustrated example, the particle beam source 3 is an electron beam source, the present disclosure is not limited thereto. It is also conceivable that the particle beam source is an ion beam source for generating an ion beam in order to operating the particle beam system 1.

The particle beam 11 is accelerated between the electrode 9 and the entry electrode 13 of a beam tube 15 and enters the beam tube 15 with a high kinetic energy. To this end, an electrical potential of the beam tube 15 is controlled by controller 7 via port 16. The kinetic energy of the electrons of the particle beam 11 in the beam tube 15 may range between 8 and 30 keV.

A lower end 17 of the beam tube 15 is in contact with a scintillator arrangement 21, which comprises a light guide body 23, having a through hole 25, for letting the particle beam 11 pass through the scintillator arrangement 21. After having passed the scintillator arrangement 21, the particle beam 11 is incident on an object plane 27. In the object plane, an object, which is to be inspected with the particle beam system 1, is arrangeable.

The inner surface of the through hole 25 is provided with an electrically conductive layer such that the inner surface of the through hole 25 is placed at the same electrical potential as the beam tube 15 by the contact between the inner surface of the through, hole 25 and the beam tube 15. Therefore, the particle beam 11 traverses the through hole 25 of the scintillator arrangement 21 with the same kinetic energy as in the interior of the beam tube 15.

A surface 29 of the scintillator arrangement 21 which faces the object plane 27 is provided with a layer of a scintillator material. The layer of the scintillator material may be electrically conductive or may be isolating, but provided with an electrically conductive layer, which faces the object plane. By way of example, the layer may be made of scintillating material P47, which is not conductive. An electrically conductive layer of alumina may be disposed on the scintillator material P47, wherein the layer of alumina is traversed by the incident electrons before entering the layer made of P47. Furthermore, the conductive layer of alumina reflects light, which is generated within the scintillator material. Scintillator material P47 is available from various suppliers such as Agar Scientific Ltd., Stansted, England and from Energy-Beam Sciences, East Granby, Conn., U.S.A.

The layer 31 is in contact with the electrically conductive layer on the inner surface of the through hole 25, such that the surface 29 is placed at the same electrical potential as the beam tube 15. The layer 31 is thereby an end electrode of the beam tube which is extended by the scintillator arrangement 21 in a direction towards the object plane 27.

In a projection along a main axis 32 (or optical axis) of the particle beam system 1, the end electrode 31 has an annular cross section. An annular electrode 33 is arranged between the surface 29 of the scintillator arrangement 21, which faces the object plane 27 and the object plane 27. The electrical potential of the electrode 33 is controlled by the controller 7 via port 34. The controller 7 places the electrode 33 at the same potential as the object 35, which is arranged in the object plane 27. Alternatively, the controller places the electrode 33 at an electrical potential which is between the electrical potential at which the object 35 is placed and the electrical potential of the beam tube 15. The particles of the particle beam, which leave the scintillator arrangement 21, are retarded and focused between the end electrode, which is provided by the layer 31 of the beam tube 15 and the electrode 33 by an electrostatic field between the electrode 33 and the layer 31. Thereby, a focus of the particle beam 11 is formed in the object plane 27. The landing energy of the particles of the beam 11 at the object 35 is determined by the difference of the electrical potentials at which the cathode 5 and the object 35 are placed.

The layer 31, which functions as an end electrode and the electrode 33 together act as an electrostatic focusing lens and form a part of an objective lens 39 of the particle beam system. The objective lens 39 further comprises a magnetic focusing lens 41 which comprises first pole piece 42, which is arranged close to the object plane 27 and a second pole piece 43, which is arranged at a greater distance from the object plane 27 than the first pole piece 42. A gap is formed between an inner lower end of the first pole piece 42 and an inner lower end of the second pole piece 43, in which a magnetic field is generated, which focuses the particle beam 11. The magnetic field is generated by windings of a coil 45, which is arranged between the first and the second pole piece 42, 43.

The objective lens 41 of the example, which is illustrated in FIG. 1 comprises a magnetic objective lens and an electrostatic objective lens. The present disclosure is, however, not limited to such a combination of magnetic and electrostatic objective lenses. It is also conceivable that the objective lens is a purely magnetic objective lens or a purely electrostatic objective lens. The objective lens 41 focuses the particle beam 11 such that a focus is formed in the object plane 27, i.e. a cross-sectional area of the beam is particularly small or even has a minimum.

A deflector unit 47 is arranged along the path of the particle beam 11 between the particle beam, source 3 and the object plane 27. The deflector unit is controlled by the controller 7 via ports 48. The deflector unit 47 is configured to deflect, the particle beam 11 such that an impingement location 49 of the particle beam 11 in the object plane 27 is displaceable in the object plane. In particular, the beam focus is scanable over a portion of the object plane 27.

The particle beam 11, which is incident on the impingement location 49, generates events, which cause electrons to emanate from the object 35. In case the particle beam 11 is an electron beam, the emanating electrons are denoted as either secondary electrons or back scattered electrons.

An exemplary trajectory of such an electron, which emanates from the object 35 is denoted in FIG. 1 with, reference sign 51. The electron, which moves along this trajectory 51 is incident on the layer 31 of a scintillator material and generates one or more light rays. One of such light rays is illustrated in FIG. 1 by a trajectory 53. This light ray is reflected in the scintillator arrangement 21 several times and exits from the light guide body 23 via the light exit face 55 of the scintillator arrangement 21. Then, the light ray enters a light guide 57 which guides the light to a photo detector 59, which detects the incident light and generates an electrical detection signal, which corresponds to the incidence light. The electrical detection signal is output via port 60 to the controller 7.

Hence, the scintillator arrangement 21 is configured to receive electrons, which emanate from the object plane 27 or which emanate from the object 35, which is arranged in the object plane 27 at the surface 29. The scintillator arrangement 21 is further configured to output light rays at the light exit face 55 after having received the electrons. The light rays are generated by a scintillator event generated by electrons, which have been received at the electron receiving surface. The scintillator arrangement 21 together with the photo detector 59, which transforms the generated light rays into electrical signals, form a scintillation detector of the particle beam, column 1.

The light guide body 23 is rotationally symmetric with respect to the axis 32 and is integrally formed from a single piece of material. However, it is also conceivable, that the light guide body is formed from a plurality of pieces, which are arranged distributed around the main axis 32 (or optical axis) or which are arranged in a different, way.

One, two or more photo detectors 59 may be provided, which are connected via light guides to the light exit face 55, In particular, a plurality of light guides 57 or photo detectors 59, respectively, may be provided, for receiving light, which exits from the light exit face 55 or from partial areas of the light exit face 55. The plurality of light guides 57 and photo detectors 59, respectively, may be arranged at a plurality of angular locations around the axis 32.

The light exit face 55 or partial areas of the light exit face 55 may be provided with an electrically conductive and light transmissive layer or coating. Thereby, the light exit face 55 is placed at a predetermined electrical potential. The electrically conductive and light transmissive layer or coating may tor example be made or Indium Tin oxide (ITO).

A distance between the electron receiving surface 29 and the light exit face 55 of the scintillator arrangement 21, measured along the optical axis 32 of the objective lens 41, is greater than a focal length of the objective lens 41, This is also illustrated in the schematical illustration of FIG. 1, since the focal length of the objective lens, which consists of the electrostatic objective lens and the magnetic objective lens, is smaller than the focal length of the magnetic objective lens. The focal length of the magnetic objective lens is smaller than a distance between an inner lower end of the second pole piece 43 and the object plane 27.

Furthermore, a principal plane of the objective lens 41, which is denoted in FIG. 1 with reference sign 67, is located at a greater distance from, the object plane 27 than the light entrance surface 29 of the scintillator arrangement 21. Furthermore, the light exit face 55 of the scintillator arrangement 21 is located at a greater-distance from the object plane 27 than the principal plane 67.

The light guide body 23, which is illustrated in FIG. 1, has a conical shape and a cross-sectional area of the conical shape perpendicular to the optical axis 32 increases with increasing distance from the object plane 27, In particular, in a region at the light exit face 55, the cross-sectional area is more than two times as large as in a region at the electron receiving surface 29. An area of a cross-section comprising a portion of the light exit face 55 is more than two times greater than a cross-section comprising a portion of the electron receiving surface 29.

A maximum extent of the light guide body, measured perpendicular to the main axis 32 (or optical axis), i.e. the maximum outer diameter of the conical light guide body 23 of the present example is smaller than a distance between a location on the electron receiving surface 29, which is closest to the object plane and the plane, in which the maximum extent of the light guide body is measured. In the representation of FIG. 1, this can be seen from the height of the light guide body 23 being greater than its width.

The particle beam system described herein comprises a scintillator arrangement having an electron receiving surface 29, which is located relatively close to the object plane 27 of the objective lens 41. Furthermore, the particle beam system comprises a light exit face 55, which is located far from the object plane 27 compared to the electron receiving surface 29. Thereby, it is possible that scintillator arrangement is received within the objective lens 41 without taking up too much of installation space within the objective lens. The scintillator arrangement further ensures that the light rays, which are generated in the scintillator arrangement are transmitted to the subsequent components, such as the light detectors 59.

In the following, further embodiments of a particle beam system are described. Components, which correspond to components of the particle beam system shown in FIG. 1, with regard to their composition or their structure and/or function are generally designated with the same reference numerals, which however have an additional letter added to show differentiation. Furthermore, it is referred to the description of the corresponding components as described above.

Figure 2:
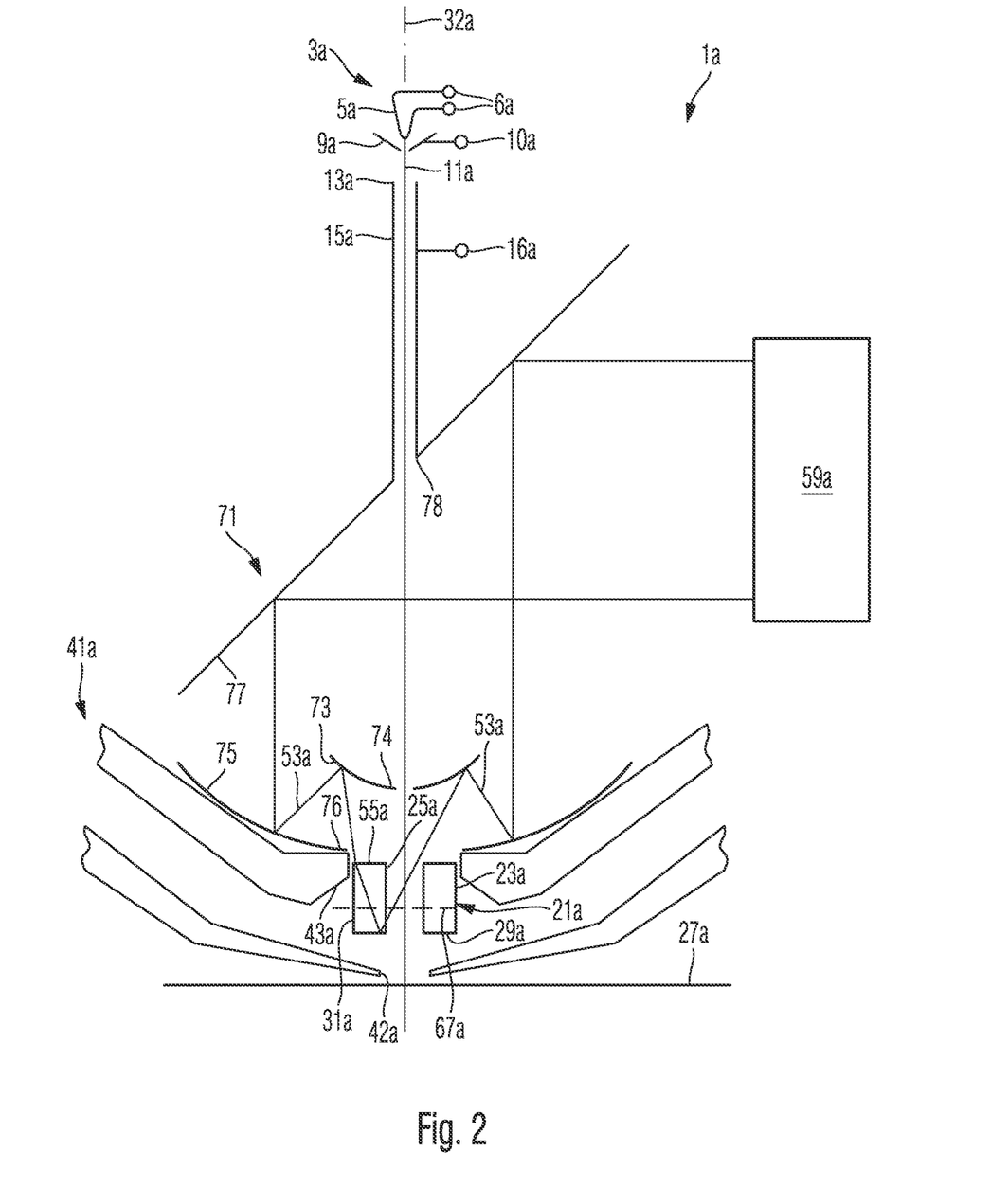
FIG. 2 is a schematical representation of a part of a particle beam system according to a second exemplary embodiment.

FIG. 2 shows a particle beam system la having a particle beam column 3a for generating a particle beam 11a, which traverses a beam tube 15a and then is focused by the objective lens 41a onto an object plane 27a.

To this end, the objective lens 41a comprises a magnetic objective lens 41a, which comprises a pole piece 42a, which is arranged close to the object plane 27a and a pole piece 4 3a, which is arranged distant from the objective plane 27a. A magnetic field, which focuses the electron beam 11a is generated by a coil (not illustrated in FIG. 2) between pole pieces 42a and 43a. In a bore of the pole piece 43a, a scintillator arrangement 21a is arranged, which comprises an electron receiving surface 29a, which is located close to the object plane 27a and faces the object plane 27a. The electron receiving surface 29a is formed by a layer 31a of scintillator material. Electrons, which emanate from the object, plane 27a or which emanate from an object which is arranged in the object plane 27a, respectively, may impinge onto the electron receiving surface 29a and may generate scintillation events in the layer 31a. Two exemplary trajectories, which are generated thereby, are denoted in FIG. 2 with reference sign 53a. The light rays may be transmitted by one or more internal, reflections in a cylindrical light guide body 23a of the scintillator arrangement 21a to an upper light exit face 55a. of the scintillation arrangement 21a. The cylindrical light guide body comprises a channel or through-hole 25 for the passage of the particle beam. There, the light rays may exit from the scintillator arrangement 21a. However, it is also possible that light rays exit from surfaces of the light guide body 23a, which are different from the upper light exit faces 50a, which are illustrated in FIG. 2. For one of these two illustrated exemplary light rays 53a, this is shown in FIG. 2, since this light ray exits from a lateral surface of the channel or through hole 25a of the light guide body 23, which is traversed by the particle beam 11a on its way to the object plane 27a.

The upper light exit face 55a and the surface of the through hole or channel 25a, i.e. the interior surface of the through hole or channel, which acts as a light exit face of the scintillator arrangement 21a, are coated by a light transmissive coating such as ITO. Thereby, an unintentional electrical charging of these surfaces during the operation of the particle beam system la is prevented.

Unlike the particle beam system, which is described with reference to FIG. 1, the particle beam system la which is described with reference to FIG. 2 does not comprise light guides, which directly follow or are in contact with light exit faces of the scintillator arrangement 21a and which are configured to conduct light, which exits from the light exit faces to the photo detector. Rather, the particle beam system la comprises a mirror system 71, which is configured to guide light rays, which exit from the light exit faces 55a, 25a of the scintillator arrangement 21a to a photo detector 59a. The mirror system 71 comprises a convex mirror surface 73 having a central through hole 74 for the particle beam 11a. The central through-hole 74 is configured such that the particle beam passes through the through-hole 74. The mirror system. 71 further comprises a concave mirror surface 75, also having a central through hole 76 for the passage of the particle beam 11a and the passage of light rays, which exit from the light exit faces 55a, 25a. Furthermore, the mirror system 71 comprises a plane mirror surface 77 having a through, hole 78 for the passage of the particle beam 11a. The convex mirror surface 73 and the conceive mirror surface 75 are configured as or substantially as a Cassegrain mirror system. Thereby, light rays, which exit from the light exit faces 55a, 25a of the scintillator arrangement are first incident on the convex mirror surface 73 and are reflected by the convex mirror surface 73 towards the concave mirror surface 75. At the concave mirror surface 75, the light rays are reflected into a direction towards the plane mirror surface 77. At the plane mirror surface 77, the light rays are reflected towards the photo detector 59a.

The electron receiving surface 29a of the scintillator arrangement 21a is located significantly closer to the object plane 27a than the light exit face 55a, which is located farthest away from the object plane 27a. In particular, similar to the exemplary embodiment, as described with reference to FIG. 1, a distance, which is measured along the optical axis 32a of the objective lens 41a between the electron receiving surface 29a and the light exit face 55a is greater than 0.2 times or greater than 0.4 times the focal length of the objective lens 41a. Furthermore, a principal plane 67a of the objective lens 41a is arranged between the electron receiving surface 29a and the light exit face 55a, which is located distant or farthest away from the object plane 27a, The principal plane 67a may be the principal plane among all principal planes of the objective lens, which is located closest to the object plane or closest to the particle beam source.

This configuration of the scintillator arrangement 21a allows to arrange the electron receiving surface of the scintillator arrangement close to the object plane 27a of the objective lens 41a without taking up much installation space within the objective lens 41a and further ensuring that the light rays, which are generated by the scintillator arrangement are effectively transmitted to the photo detector 59a.

Figure 3:
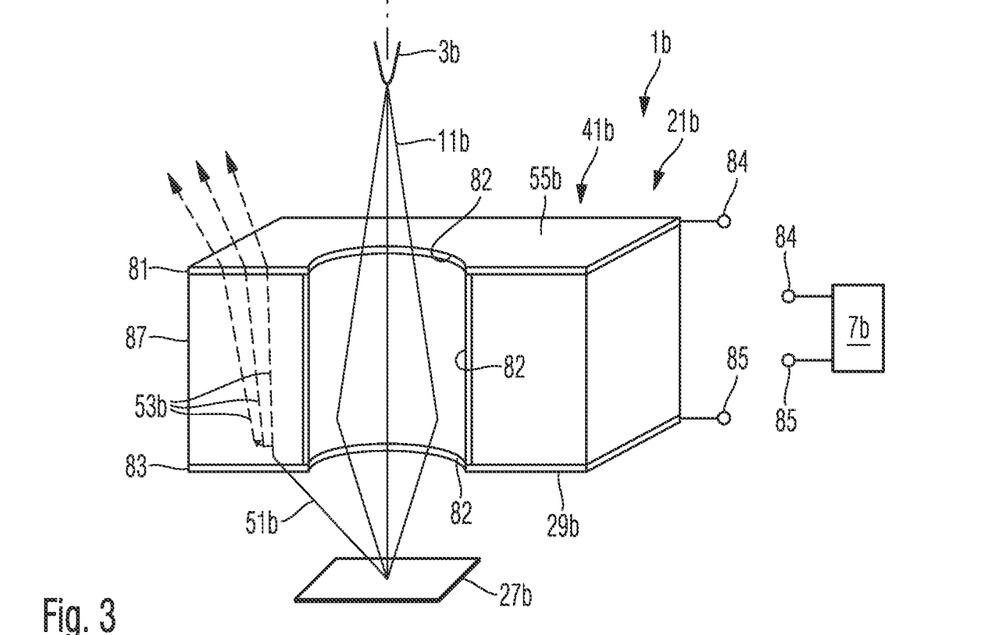
FIG. 3 is a schematical representation of a part of a particle beam system according to a third exemplary embodiment.

FIG. 3 shows a portion of the particle beam system 1b in a partially cross-sectional perspective illustration. A divergent particle beam 11b, which emanates from a particle beam source 3b is focused by an objective lens 41b onto an object plane 27b. The objective lens 41b is formed from two electrodes 81 and 83, which are arranged parallel to the object plane 27b and at a distance from each other. Each of the electrodes 81 and 83 comprises a circular though-hole 82 for the passage of the particle beam 11b. The electrodes 81 and 83 are connected via ports 84 and 85 to a controller 7b. The controller 7b is configured to set the electrodes 81 and 83 at different electrical potentials, such that an electrostatic field is generated between the electrodes 81 and 83, which has a focusing effect on the particle beam 11b.

Both of the electrodes 81 and 83 of the objective lens 41b are also components of a scintillator arrangement 21b. The electrode 83 of the objective lens 41b, which is located closer to the object plane 27b, provides an electronic receiving surface 29b for the scintillator arrangement 21b. Furthermore, the electrode 81 of the objective lens 41b, which is located farther from the object plane 27b, provides a light exit face 55b for the scintillator arrangement 21b. The scintillator arrangement 21b further comprises a body 87, which is arranged between the electron receiving surface 29b and the light exit face 55b. The body 87 is made of a scintillator material, such as a plastic scintillator. Such a plastic scintillator may, for example be obtained from Saint-Gobain Crystals, Hiram, Ohio, USA, which distributes such scintillators, under the mark BC-400. The body 87 also comprises a through-hole 82. for the passage of the particle beam 11b, and which is aligned with the through-holes 82 in the electrodes 81 and 83. The through-hole 82 of the body 87, made of scintillator material, is provided at its inner surface with an electrically conductive resistance layer. The resistance layer is configured such that its electrical resistance is large enough such that between the electrodes 81 and 83, no short circuit occurs. Thereby, it is possible for the controller 7b to maintain the required electrical potential difference between the electrodes 81 and 83. The resistance layer is further configured such that the conductivity is high enough such that an unwanted electrostatic charging at the inner surface of the through-hole 82 does not occur during operation of the particle beam system 11b.

An exemplary trajectory of an electron, which emanates from the object plane 27b is denoted with reference numeral 51b in FIG. 3. This electron traverses the electron receiving surface 29b and the electrode 83, respectively, and penetrates into the body 87 of scintillator material. In the scintillation body 87, the penetrating electron generates a plurality of light beams, which are denoted with reference numeral 53b in FIG. 3. These exemplary illustrated light rays travel away from the object plane 27b and traverse the light exit face 55b of the scintillator arrangement 21b or the electrode 81, of the objective lens 41b, respectively. Then, the light rays may be detected by a photo detector, which is not illustrated in FIG. 3. Optical systems may be provided between the light exit face 55b of the scintillator arrangement 21b and the photo detector, such as light guides or mirror systems or lens systems or a combination thereof.

The electrode 83, which provides the electron receiving surface 29b, may be formed from a metal, which is deposited on the body 87 of scintillator material.

The electrode 81 of the objective lens 41*b*, which provides the light exit face 55*b* of the scintillator arrangement 21*b*, is made of an electrically conductive and light transmissive material, such as indium tin oxide.

In the exemplary embodiment of the particle beam system 11*b*, as described with reference to FIG. 3, and similar to the exemplary embodiments, as described with reference to FIGS. 1 and 2, the electron receiving surface 29*b* of the scintillator arrangement 21*b* is arranged considerably closer to the object plane 27*b* of the particle beam system 1*b* than the light exit face 55*b* of the scintillator arrangement 21*b*. In particular, a principal plane of the objective lens is arranged between the electrodes 81 and 83 and thereby also between the electron receiving surface 29*b* and the light exit face 55*b*.

Figure 4:
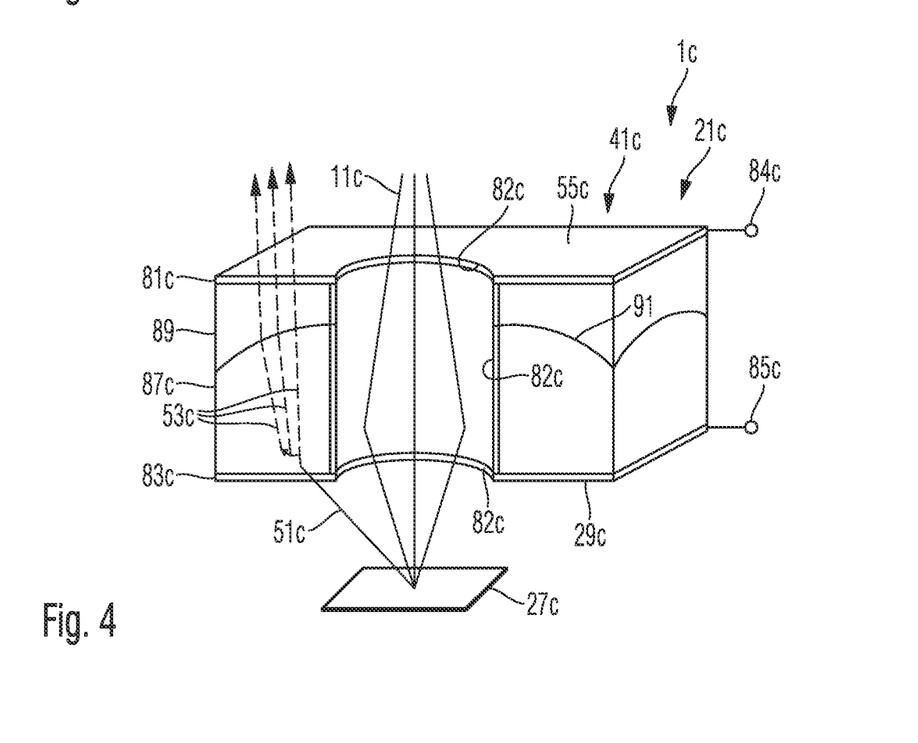
FIG. 4 is a schematical representation of a part of a particle beam system according to a fourth exemplary embodiment.

FIG. 4 shows a further exemplary embodiment of a particle beam system 1*c*. The particle beam system 1*c* has a design similar to the particle beam system, as described with reference to FIG. 3. Also in the particle beam system 1*c*, an electrostatic objective lens 41*c* is formed by two electrodes 81*c* and 83*c*, which, furthermore provide a light exit face 55*c* and an electron receiving surface 29*c*, respectively, of a scintillator arrangement 21*c*. Unlike the particle beam system, as described with reference to FIG. 3, in the particle beam system, which is illustrated in FIG. 4, a space between the electrodes 81*c* and 8 3*c* is not completely filled with a body 87*c* made of scintillator material. Rather, a body 87*c* of scintillator material only occupies a portion of the space between the electrodes 81*c* and 83*c*. A body 89, which is formed from a. light transmissive material and which is not a scintillator, is inserted between the electrode 81*c* and the body 87*c* of scintillator material. An interface 91 between the body 89 of light transmissive material and the body 87*c* of scintillator material is configured to have a curved shape. Since the bodies 87*c* and 89 are made of materials having different refractive indices, light rays 53*c*, which are generated by scintillation in the body 87*c* and which travel in different directions, are slightly collimated by a refraction at the interface 91, Thereby, the light rays 53*c* are less divergent when emanating from the light exit face 55*c*.

Figure 5:
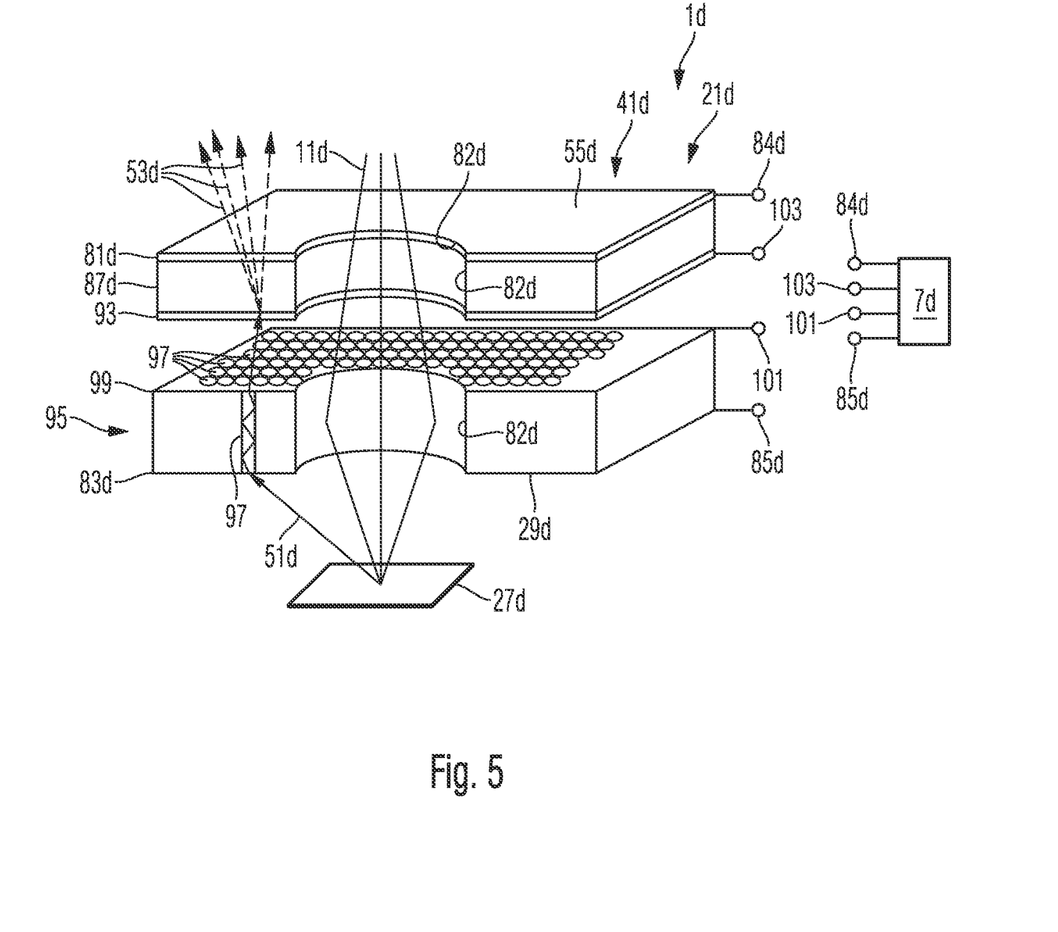
FIG. 5 is a schematical illustration of a part of a particle beam system according to a fifth exemplary embodiment.

A further embodiment of the particle beam system 1*d*, which is designed similarly to the exemplary embodiments, as described with reference to FIGS. 1 to 4 is schematically illustrated in FIG. 5. The particle beam system 1*d* comprises a scintillator arrangement 21*d* having an electron receiving surface 29*d*, a light exit face 55*d* and a scintillator material, which is arranged between the electron receiving surface 29*d* and the light exit face 55*d*. In the illustrated exemplary embodiment, the scintillator material is configured as a thin layer 93, which is supported by a light guide body 87*d*, The light guide body 87*d*. also supports an electrode 81*d*, which provides the light exit face 55*d*. Unlike the exemplary embodiments, as described above, the scintillator arrangement 21*d* of the particle beam system 1d comprises an electron guide 95, which is arranged between the electron receiving surface 29*d*. and the scintillator material 93, The electron guide 95 is configured as a micro channel plate, which comprises a plurality of tubes or channels 97, The plurality of tubes or channels 97 are comparatively small. One of the channels is exemplary shown in cross section in FIG. 5, Electrons 5 Id. enter into the tubes or channels 97 by passing through the electron receiving surface 29*d*. The electron receiving surface may comprise holes through which the electrons enter into the tubes or channels 97. The electrons are multiplied when they impinge on an inner surface of the tubes or channels 97, To this end, the micro channel plate comprises an electrode 83*d* on a side facing the electron receiving surface 29*d* and an electrode 99 on a side of the micro channel plate, opposite to the electrode 83*d*. The electrodes 83*d* and 99 are connected to controller 7*c* via ports 85*d* and 101, Controller 7*c* is configured to set the electrodes 83*d* and 99 at electrical potentials for providing a sufficient potential difference between the electrodes 83*d* and 99 such that the electrons which enter the tubes or channels 97 are multiplied. The electrons, which exit from the electrode 99 of the electron guide 95 and which are multiplied in the described exemplary embodiment, are accelerated towards the scintillator material. The layer of scintillator material 93 is configured as an electrode, which is placed at an electrical potential by controller 7*c* via port 103. Thereby, the electrons, which exit the electron guide 95 are accelerated towards the scintillator material 93. In the scintillator material 93, the scintillation events are generated by the impinging electrons. The scintillation events generate light rays 53*d*, which exit at the light exit face 55*d* and are detected by a detector, which is arranged downstream of the light exit face 55*d* (not illustrated in FIG. 5).

The electrodes 81*d*, 93, 99 and 83*d* together form an electrostatic objective lens 41*d*. To this end, the electrical potentials, to which the ports 84*d*, 103, 101 and 85*d* are set by the controller 7*c* are configured such that the potential difference between the electrodes 99 and 83*d* does not only multiply the electrons within the electron guide 95 but also focuses a particle beam 11*d* on the object plane 27*d*. The particle beam lid passes through through-holes 82*d* formed in the light guide body 87*d* and the micro channel plate 95. The through hole of the light guide body 87*d* is aligned with the through-hole of the micro channel plate 95.

Similar to the exemplary embodiments, as described with reference to FIGS. 3 and 4, also in the particle beam system 1*d*, the electron receiving surface 29*d* of the scintillator arrangement 21*a* is located closer to the object plane 27*d* compared to the principal plane of the objective lens 41*d*. Furthermore, the light exit face 55*d* of the scintillator arrangement 21*d* is arranged at a greater distance from the object plane 27*d* than the principal plane of the objective lens 41*d*.

The particle beam systems, which are described with reference to FIGS. 1 to 5 may be used in a plurality of applications. By way of example, the particle beam system may be what is commonly known as a "Variable Pressure System" or an "Extended Pressure System". Such particle beam systems are configured such that they are operable at a pressure level in the sample chamber or in a region surrounding the sample, which is higher than 1 Pa, in particular within a range between 1 Pa and 300 Pa. Such systems comprise differential pressure apertures, which are arranged within the objective lens and which are configured to maintain a sufficient vacuum within the particle beam column and in particular in a region surrounding the particle beam, source. Thereby, it is possible that the vacuum level on the side of the differential pressure aperture which faces the particle beam source is significantly higher than on the side of the differential pressure aperture, facing the object. In such systems, only a comparatively small portion of electrons, which emanate from the object pass through the differential pressure apertures and reach a detector, which is arranged behind the differential pressure aperture. Hence, the detector signal level is comparatively slow. Therefore, it is advantageous for such systems, when the electron receiving surface of the scintillator arrangement is located closer to the object than the differential pressure aperture, which is located closest to the object among all differential pressure apertures. It is also advantageous for such system, when the scintillator arrangement forms part of a differential pressure aperture or even is a differential pressure aperture. In this case, the electron receiving surface of the scintillator arrangement may be configured as an object side surface of the differential pressure aperture. The diameter of an aperture of the electron receiving surface for the passage of the primary-beam may for example be smaller than 1 mm and may in particular be within a range from 0.4 mm to 0.7 mm.

While the invention has been described with respect to certain exemplary embodiments thereof, it is evident that many alternatives, modifications and variations will be apparent to those skilled in the art. Accordingly, the exemplary embodiments of the invention set forth herein are intended to be illustrative and not limiting in any way. Various changes may be made without departing from, the spirit and scope of the present invention as defined in the following claims.

The invention claimed is:

1. Particle beam system, comprising:
a particle beam source for generating a particle beam;
an objective lens for focusing the particle beam onto an object plane, wherein the objective lens comprises a focal length and an optical axis;
a scintillator arrangement, which comprises an electron receiving surface facing the object plane and which is arranged such that it is exposed to electrons, which emanate from the object plane, wherein the scintillator arrangement further comprises a light exit face, wherein the scintillator arrangement is configured such that light rays which are generated by electrons, which are incident on the electron receiving surface leave the scintillator arrangement at the light exit face;
wherein at least one of the following conditions holds:
a first distance measured parallel to the optical axis between the electron receiving surface and the light exit face is greater than 0.2 times, or greater than 0.4 times the focal length of the objective lens, or greater than the focal length of the objective lens;
the electron receiving surface, when measured along a direction parallel to the optical axis, is located closer to the object plane than a principal plane of the objective lens; and the light exit face, when measured along the direction parallel to the optical axis, is located at a greater distance from the object plane than the principal plane of the objective lens;
the scintillator arrangement comprises a light guide body having a maximum cross-sectional area perpendicular to the optical axis, which is at least two times greater than an area of a projection of the electron receiving surface onto a plane perpendicular to the optical axis; or
a maximum cross-sectional extent of the light guide body perpendicular to the optical axis is smaller than a second distance measured parallel to the optical axis between a location on the electron receiving surface which is closest to the object plans and a plane of the maximum cross-sectional extent.

2. The particle beam system according to claim 1, wherein the scintillator arrangement comprises an electrically conductive layer, which provides the electron receiving surface.

3. The particle beam system according to claim 2, wherein the scintillator arrangement comprises at least one of a body of scintillator material and a layer of a scintillator material, wherein the at least one of a body or layer of scintillator material supports the electrically conductive laver.

4. The particle beam system according to claim 2, further comprising a beam tube which is configured such that the particle beam passes through the beam tube between the particle beam source and the object plane;
wherein the particle beam system further comprises a voltage supply, which is configured to place the beam tube and the electrically conductive layer, which provides the electron receiving surface of the scintillator arrangement at a first potential; and to place an object, which is arranged in the object plane at a second electrical potential, which is different from the first electrical potential.

5. The particle beam system according to claim 4, further comprising a first electrode, which is traversed by the particle beam, wherein the first electrode is arranged closer to the object plane than the electron receiving surface of the scintillator arrangement, wherein the voltage supply is configured to place the first electrode at the second electrical potential or to place the first electrode at a third electrical potential, wherein the third electrical potential is between the first and the second electrical potential.

6. The particle beam system according claim 5, wherein the objective lens comprises a magnetic lens having a first and a second pole piece, wherein a lower end of the first pole piece is located closer to the object plane than a lower end of the second pole piece; wherein the first electrode is provided by the first pole piece.

7. The particle beam system according to claims 1, wherein the scintillator arrangement comprises an electrically conductive and light transmissive layer, which is configured to provide the light exit face.

8. The particle beam system according to claim 7, further comprising a voltage supply, which is configured to place the electrically conductive layer which provides the electron receiving surface of the scintillator arrangement at a first electrical potential and further to place the electrically conductive and light transmissive layer, which provides the light exit face of the scintillator arrangement at a fourth electrical potential, which is different from the first electrical potential.

9. The particle beam system according to claim 7, wherein the objective lens comprises an electrostatic lens, wherein the electrostatic lens comprises
the conductive layer which provides the electron receiving surface of the scintillator arrangement; and
the electrically conductive and light transmissive layer which provides the light exit face of the scintillator arrangement,
wherein the conductive layer and the electrically conductive and light transmissive layer form electrodes of the electrostatic lens.

10. The particle beam system according to claim 1, wherein the scintillator arrangement comprises a body or a layer of a scintillator material, which provides the electron receiving surface.

11. The particle beam system according to claims 1, wherein the scintillator arrangement further comprises a micro channel plate having an entrance surface, which provides the electron receiving surface.

12. The particle beam system according to claim 11, wherein the scintillator arrangement comprises a scintillator material, wherein the scintillator material is arranged between an exit face of the micro channel plate and the light exit face of the scintillator arrangement.

13. The particle beam system according to claim 1, wherein a lateral surface of the light guide body has a conical shape, which conically tapers in a direction towards the object plane.

14. The particle beam system according to claim 1, wherein a shortest distance between the electron receiving surface and the object plane is equal to a shortest distance between the objective lens and the object plane or is greater than the shortest distance between the objective lens and the object plane.

15. The particle beam system according to claim 1, wherein the objective lens comprises a magnetic lens having a first and a second pole piece, where in a lower end of the first pole piece is located closer to the object plane than a lower end of the second pole piece.

16. The particle beam system according to claim 1, further comprising
- a light detector for generating electrical signals based on light, which is incident on the light detector; and
- a transfer optical system, which is configured to guide light, which exits from the light exit face or the scintillator arrangement to the light detector.

17. The particle beam system according to claim 16, wherein the transfer optical system comprises at least one light guide.

18. The particle beam system according to claim 16, wherein the transfer optical system comprises at least one mirror, or at least one or a combination of a convex mirror and a concave mirror.

19. The particle beam system according to claim 1, wherein the light guide body comprises at least two components, which are made of materials having different refractive indices.

20. The particle be system according to claim 19, wherein an interface between the two components has a curved shape.

21. The particle beam system according to claim 1, wherein a portion of the electron receiving surface and a portion of the objective lens are located in a common plane, which is oriented perpendicular to the optical axis.

\* \* \* \* \*

UNITED STATES PATENT AND TRADEMARK OFFICE
CERTIFICATE OF CORRECTION

PATENT NO.      : 8,598,525 B2
APPLICATION NO. : 13/176746
DATED           : December 3, 2013
INVENTOR(S)     : Dirk Zeidler et al.

It is certified that error appears in the above-identified patent and that said Letters Patent is hereby corrected as shown below:

In the Specifications

Column 6, line 51, "conceive" should read "concave"

Column 13, line 6, "11b" should read "1b"

Column 13, line 10, "lb" should read "1b"

Column 13, line 25, "8 3c" should read "83c"

Column 13, line 53, "Id" should read "1d"

Column 13, line 59, "5," should read "5."

Column 13, line 60, "5 Id" should read "51d"

Column 13, line 65, "97," should read "97."

Column 14, line 27, "lid" should read "11d"

Column 14, line 34, "21α" should read "21d"

In the Claims

Column 15, claim 3, line 63, "laver" should read "layer"

Column 16, claim 7, line 23, "claims 1" should read "claim 1"

Column 16, claim 11, line 50, "claims 1" should read "claim 1"

Column 17, claim 20, line 24, "be" should read "beam"

Signed and Sealed this
Twenty-ninth Day of April, 2014

Michelle K. Lee
*Deputy Director of the United States Patent and Trademark Office*